United States Patent
Miyashita

(10) Patent No.: US 12,388,445 B2
(45) Date of Patent: Aug. 12, 2025

(54) LEVEL SHIFT CIRCUIT

(71) Applicant: ROHM CO., LTD., Kyoto (JP)

(72) Inventor: Takashige Miyashita, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 96 days.

(21) Appl. No.: 18/448,558

(22) Filed: Aug. 11, 2023

(65) Prior Publication Data

US 2024/0072805 A1 Feb. 29, 2024

(30) Foreign Application Priority Data

Aug. 24, 2022 (JP) ................................ 2022-133149

(51) Int. Cl.
*H03K 19/0185* (2006.01)
*H03K 3/356* (2006.01)

(52) U.S. Cl.
CPC ............ *H03K 19/018521* (2013.01); *H03K 3/356113* (2013.01)

(58) Field of Classification Search
None
See application file for complete search history.

(56) References Cited

U.S. PATENT DOCUMENTS

| | | | |
|---|---|---|---|
| 5,896,043 A * | 4/1999 | Kumagai | H03K 3/356113 326/17 |
| 9,948,302 B2 * | 4/2018 | Takada | H03K 17/162 |
| 2008/0238525 A1 * | 10/2008 | Flaibani | H03K 3/356113 327/333 |
| 2023/0130933 A1 * | 4/2023 | Fukushima | H02M 3/156 323/205 |

FOREIGN PATENT DOCUMENTS

JP 2017-169029 9/2017

* cited by examiner

*Primary Examiner* — Kenneth B Wells
(74) *Attorney, Agent, or Firm* — Fish & Richardson P.C.

(57) ABSTRACT

A level shift circuit includes a low voltage side circuit arranged to receive an input signal, and a high voltage side circuit arranged to output an output signal obtained by level shifting the input signal. The low voltage side circuit includes a switching transistor arranged to switch between on state and off state according to level of the input signal, and a capacitor connected in a path where current flows from the high voltage side circuit via the switching transistor. When the switching transistor switches to on state, rush current is generated, which is a transitional large current flowing through the path by the capacitor, so that level of the output signal is switched.

10 Claims, 8 Drawing Sheets

- PRIOR ART -

US 12,388,445 B2

LEVEL SHIFT CIRCUIT

CROSS-REFERENCE TO RELATED APPLICATIONS

This nonprovisional application claims priority under 35 U.S.C. § 119(a) on Patent Application No. 2022-133149 filed in Japan on Aug. 24, 2022, the entire contents of which are hereby incorporated by reference.

BACKGROUND OF THE INVENTION

Field of the Invention

The present disclosure relates to a level shift circuit.

Description of Related Art

Conventionally, there is known a level shift circuit that changes a logic level from a low potential level to a high potential level (see, for example, JP-A-2017-169029).

DETAILED DESCRIPTION OF THE PREFERRED EMBODIMENTS

Hereinafter, an exemplified embodiment of the present disclosure is described with reference to the drawings.

Comparative Example

Here, before description of an embodiment of the present disclosure, a comparative example for comparison is described. The description of the comparative example will clarify the problem to be solved.

Figure 1:
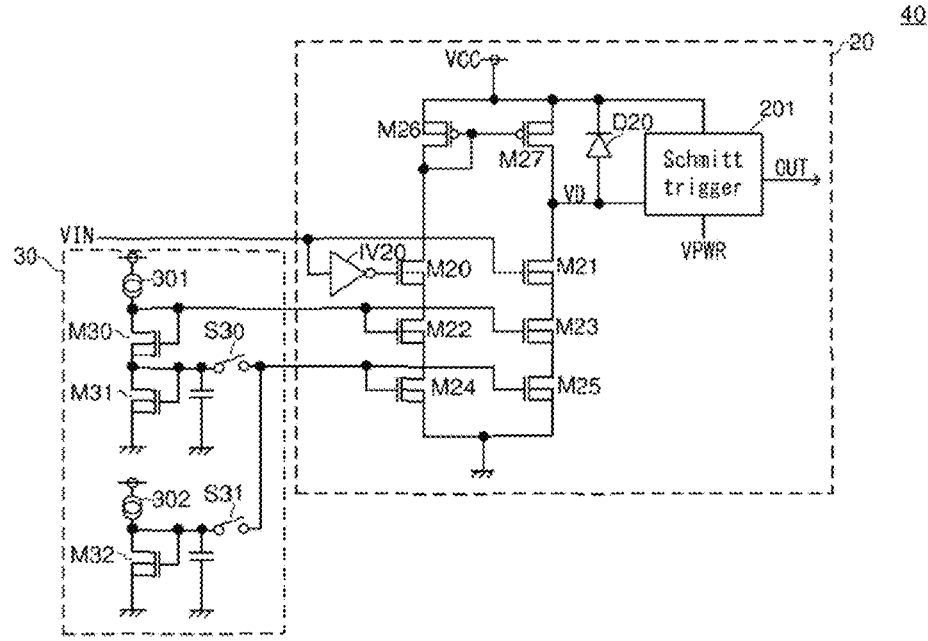
FIG. 1 is a diagram illustrating a structure of a level shift circuit according to a comparative example.

FIG. 1 is a diagram illustrating a structure of a level shift circuit 40 according to the comparative example. The level shift circuit 40 is a circuit that converts an input signal VIN of a low potential level into an output signal OUT of a high potential level, and includes a level conversion section 20 and a control circuit 30.

The level conversion section 20 is a circuit structure section that converts the input signal VIN into the output signal OUT. The input signal VIN varies between 0 V and 5 V, for example, while the output signal OUT varies between 12 V and 17 V, for example.

The level conversion section 20 includes an inverter IV20, NMOS transistors M20 to M25, PMOS transistors M26 and M27, a diode D20, and a Schmitt trigger (Schmitt buffer) 201. Note that the NMOS transistor is an N-channel type MOSFET (Metal-Oxide-Semiconductor Field Effect Transistor), and the PMOS transistor is a P-channel type MOSFET.

An input terminal of the inverter IV20 is connected to an application terminal of the input signal VIN. The output terminal of the inverter IV20 is connected to a gate of the NMOS transistor M20. A source of the NMOS transistor M20 is connected to a drain of the NMOS transistor M22. A source of the NMOS transistor M22 is connected to a drain of the NMOS transistor M24. A source of the NMOS transistor M24 is connected to an application terminal of a ground potential.

The application terminal of the input signal VIN is connected to a gate of the NMOS transistor M21. A source of the NMOS transistor IV121 is connected to a drain of the NMOS transistor M23. A source of the NMOS transistor M23 is connected to a drain of the NMOS transistor M25. A source of the NMOS transistor M25 is connected to the application terminal of the ground potential.

The PMOS transistors M26 and M27 constitute a current mirror. Specifically, sources of the PMOS transistors M26 and M27 are connected to an application terminal of a power supply voltage VCC. A gate and a drain of the PMOS transistor M26 are short-circuited. The gate of the PMOS transistor IV126 and a gate of the PMOS transistor M27 are connected to each other. A drain of the NMOS transistor M20 is connected to the drain of the PMOS transistor M26. A drain of the PMOS transistor M27 is connected to a drain of the NMOS transistor M21.

A cathode of the diode D20 is connected to the source of the PMOS transistor M27. An anode of the diode D20 is connected to the drain of the PMOS transistor M27. The Schmitt trigger 201 is connected between the application terminal of the power supply voltage VCC and a power supply voltage VPWR. The Schmitt trigger 201 outputs the output signal OUT in accordance with an input drain voltage VD (a drain voltage of the PMOS transistor M27).

For instance, when the power supply voltage VCC is 17 V and the power supply voltage VPWR is 12 V, the NMOS transistors M20 and M21 have a withstand voltage of 15 V, the NMOS transistors M22 and M23 have a withstand voltage of 5 V, and the NMOS transistors M24 and M25 have a withstand voltage of 1.5 V.

The control circuit 30 includes constant current sources 301 and 302, NMOS transistors M30 to M32, and switches S30 and S31.

A drain of the NMOS transistor M30 is connected to the constant current source 301. A gate and the drain of the NMOS transistor M30 are short-circuited. The gate of the NMOS transistor M30 is connected to gates of the NMOS transistors M22 and M23. A source of the NMOS transistor M30 is connected to a drain of an NMOS transistor M31. A gate and the drain of the NMOS transistor M31 are short-circuited. A source of the NMOS transistor M31 is connected to the application terminal of the ground potential. The gate of the NMOS transistor M31 is connected to gates of the NMOS transistors M24 and M25 via the switch S30.

A drain of the NMOS transistor M32 is connected to the constant current source 302. A gate and the drain of the NMOS transistor M32 are short-circuited. A source of the NMOS transistor M32 is connected to the application terminal of the ground potential. The gate of the NMOS transistor M32 is connected to the gates of the NMOS transistors M24 and M25 via the switch S31.

The constant current source 302 has a structure for supplying current to the level conversion section 20 in steady state, while the constant current source 301 has a structure for supplying a large current to the level conversion section 20 transiently in state change time. For instance, the constant current generated by the constant current source 302 is 5 µA, and the constant current generated by the constant current source 301 is 30 µA. For instance, if an element size ratio is M31:M24:M25=1:2:2, as the constant current source 301 supplies current of 30 µA to the NMOS transistor M31, current of 60 µA flows through the NMOS transistors M24 and M25 in a transition time. In addition, for example, if M32:M24:M25=4:2:2, as the constant current source 302 supplies current of 5 µA to the NMOS transistor M32 in steady time, current of 2.5 µA flows through the NMOS transistors M24 and M25 in steady time.

An operation of the level shift circuit 40 is described. When changing the input signal VIN from 5 V (high level) to 0 V (low level), a gate voltage of the NMOS transistor M20 is changed from low level to high level, a gate voltage of the NMOS transistor M21 is changed from high level to low level. In this way, the NMOS transistor M20 is switched to on state, while the NMOS transistor M21 is switched to off state.

In this state change time, for a predetermined period time (for example, for 60 ns), the switch S30 is turned on, and the switch S31 is turned off. In this way, a large current transiently flows through the NMOS transistors M20, M22, and M24. In this case, gate voltages of the PMOS transistors M26 and M27 constituting the current mirror are lowered, and the PMOS transistor M27 is turned on. In this way, drain voltage VD becomes 17 V (VCC), and the output signal OUT of 17 V (high level) is output from the Schmitt trigger 201. Note that, after the above predetermined period time elapses, the switch S30 is turned off while the switch S31 is turned on, and current in steady state flows through the NMOS transistors M20, M22, and M24.

On the other hand, when changing the input signal VIN from 0 V (low level) to 5 V (high level), the gate voltage of the NMOS transistor M20 is changed from high level to low level, and the gate voltage of the NMOS transistor M21 is changed from low level to high level. In this way, the NMOS transistor M20 is switched to off state, and the NMOS transistor M21 is switched to on state.

In this state change time, similarly to the above description, for a predetermined period time (for example, for 60 ns), the switch S30 is on state, while the switch S31 is off state. In this way, a large current transiently flows through the NMOS transistors M21, M23, and M25. At this time, the PMOS transistor M27 is off state, and a large current flows through the diode D20. In this way, the drain voltage VD is clamped by the diode D20, and VD=17 V−5 V=12 V holds (5 V corresponds to a zener voltage of the diode D20). Therefore, the Schmitt trigger 201 outputs the output signal OUT of 12 V (low level).

In this way, in the level shift circuit 40, signal transmission from a low voltage side circuit to a high voltage side circuit in the level conversion section 20 is performed by current. In this case, as a large current is transiently supplied to the level conversion section 20 in state change time, a parasitic capacitance of the circuit can be quickly charged and discharged, and hence the level of the output signal OUT can be switched at high speed.

However, the above structure of the level shift circuit 40 requires a complicated circuit such as the control circuit 30, for transiently supplying a large current for the purpose of high speed operation. In addition, as the level shift circuit 40 uses three types of withstand voltage elements in the level conversion section 20, there is a problem that a layout area increases due to an element separation area.

<Structure of Level Shift Circuit>

Figure 2:
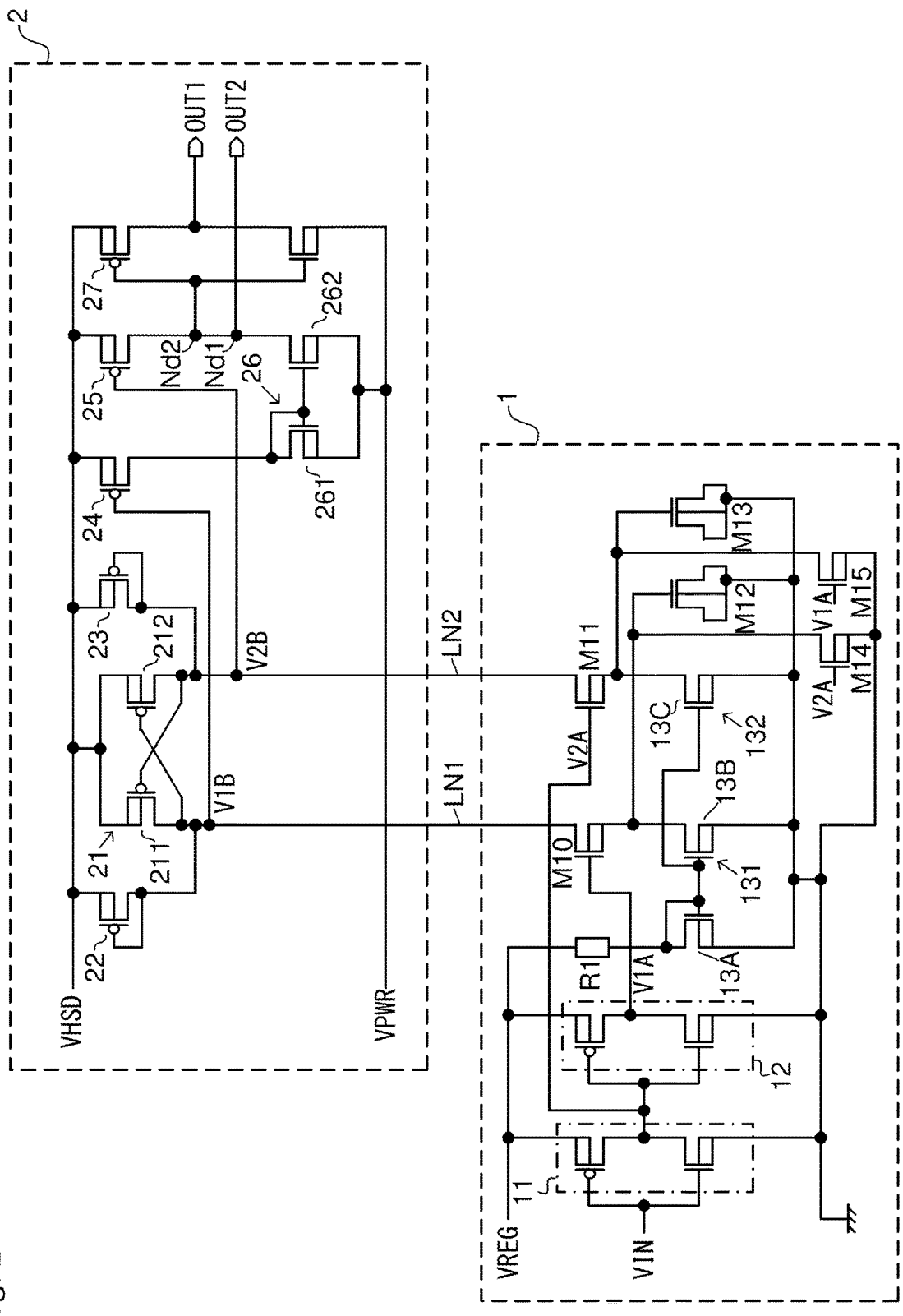
FIG. 2 is a diagram illustrating a structure of the level shift circuit according to the present disclosure.

Next, an exemplified level shift circuit of the present disclosure is described. FIG. 2 is a diagram illustrating a structure of a level shift circuit 10 according to the present disclosure. The level shift circuit 10 is a circuit that converts the input signal VIN at low potential level into output signals OUT1 and OUT2 at high potential level, and includes a low voltage side circuit 1 and a high voltage side circuit 2. The input signal VIN varies between 0 V and 5 V, for example, and the output signals OUT1 and OUT2 vary between 12 V and 17 V, for example.

The low voltage side circuit 1 includes inverters 11 and 12, current mirrors 131 and 132, switching transistors M10 and M11, MOS capacitors M12 and M13, discharge switches M14 and M15, and a resistor R1.

The inverter 11 is connected between an application terminal of an internal voltage VREG and the application terminal of the ground potential, and logically inverts the input signal VIN and outputs the result to the inverter 12. The inverter 12 is connected between the application terminal of the internal voltage VREG and the application terminal of the ground potential, and logically inverts the output of the inverter 11 so as to output the result.

The switching transistor M10 is constituted of an NMOS transistor. A gate of the switching transistor M10 is connected to an output terminal of the inverter 12. The current mirror 131 includes an input side transistor 13A and an output side transistor 13B. The input side transistor 13A and the output side transistor 13B are each constituted of an NMOS transistor. A drain of the input side transistor 13A is connected to the application terminal of the internal voltage VREG via the resistor R1. A gate and the drain of the input side transistor 13A are short-circuited. The gate of the input side transistor 13A and a gate of the output side transistor 13B are connected to each other. A drain of the output side transistor 13B is connected to a source of the switching transistor M10. Sources of the input side transistor 13A and the output side transistor 13B are connected to the application terminal of the ground potential.

The resistor R1 is disposed for generating current in steady state described later, together with the internal voltage VREG. Such a current can be generated by a constant current source, but by placing the resistor R1 between lands in the semiconductor chip, it is possible to effectively use the space. Note that the resistor R1 can also be placed in a free space or a dead space in an element placement area of the semiconductor chip.

The switching transistor M11 is constituted of an NMOS transistor. A gate of the switching transistor M11 is connected to an output terminal of the inverter 11. The current mirror 132 includes the input side transistor 13A and an output side transistor 13C. In other words, the current mirrors 131 and 132 commonly include the input side transistor 13A. The output side transistor 13C is constituted of an NMOS transistor. The gate of the input side transistor 13A and a gate of the output side transistor 13C are connected to each other. A drain of the output side transistor 13C is connected to the source of the switching transistor M11. A source of the output side transistor 13C is connected to the application terminal of the ground potential.

The MOS capacitors M12 and M13 are capacitors constituted of MOS transistors. Note that the MOS capacitors M12 and M13 may be NMOS capacitors or PMOS capacitors. In addition, a metal-insulator-metal (MIM) capacitor may be used instead of the MOS capacitor, for example.

The MOS capacitors M12 and M13 are used for transiently generating a large current in state change time as described later. The MOS capacitor M12 is connected between the source of the switching transistor M10 and the application terminal of the ground potential. The MOS capacitor M13 is connected between the source of the switching transistor M11 and the application terminal of the ground potential.

The discharge switches M14 and M15 are each constituted of an NMOS transistor, and are used for discharging the MOS capacitors M12 and M13 as described later. The discharge switch M14 is connected between the MOS capacitor M12 and the application terminal of the ground potential. The discharge switch M15 is connected between the MOS capacitor M13 and the application terminal of the ground potential.

The high voltage side circuit 2 includes a latch circuit 21, MOS diodes 22 and 23, PMOS transistors 24 and 25, a current mirror 26, and an inverter 27.

The latch circuit 21 includes PMOS transistors 211 and 212. Sources of the PMOS transistors 211 and 212 are connected to an application terminal of a high side voltage VHSD. The high side voltage VHSD is higher than the power supply voltage VPWR. A drain of the PMOS transistor 211 is connected to a gate of the PMOS transistor 212. A drain of the PMOS transistor 212 is connected to a gate of the PMOS transistor 211. A drain of the switching transistor M10 is connected to the drain of the PMOS transistor 211 via a signal line LN1. A drain of the switching transistor M11 is connected to the drain of the PMOS transistor 212 via a signal line LN2. In other words, the low voltage side circuit 1 and the high voltage side circuit 2 are connected to each other via the two signal lines LN1 and LN2.

The MOS diode 22 is constituted of a diode-connected PMOS transistor, and is connected between an application terminal of the high side voltage VHSD and the drain of the PMOS transistor 211. The MOS diode 23 is constituted of a diode-connected PMOS transistor, and is connected between the application terminal of the high side voltage VHSD and the drain of the PMOS transistor 212.

A gate of the PMOS transistor 24 is connected to the drain of the PMOS transistor 211. A source of the PMOS transistor 24 is connected to the application terminal of the high side voltage VHSD. The MOS diode 22 and the PMOS transistor 24 constitute a current mirror.

The current mirror 26 includes an input side transistor 261 and an output side transistor 262. The input side transistor 261 and the output side transistor 262 are each constituted of an NMOS transistor. A drain of the input side transistor 261 is connected to a drain of the PMOS transistor 24. A gate and the drain of the input side transistor 261 are short-circuited. The gate of the input side transistor 261 and a gate of the output side transistor 262 are connected to each other. Sources of the input side transistor 261 and the output side transistor 262 are connected to an application terminal of the power supply voltage VPWR.

A gate of the PMOS transistor 25 is connected to the drain of the PMOS transistor 212. A source of the PMOS transistor 25 is connected to the application terminal of the high side voltage VHSD. The MOS diode 23 and the PMOS transistor 25 constitute a current mirror. A drain of the output side transistor 262 and a drain of the PMOS transistor 25 are connected to each other at a node Nd1. An output signal OUT2 is output from the node Nd1.

A node Nd2, at which the drain of the output side transistor 262 and the drain of the PMOS transistor 25 are connected, is connected to an input terminal of the inverter 27. The inverter 27 is connected between the application terminal of the high side voltage VHSD and the application terminal of the power supply voltage VPWR. An output terminal of the inverter 27 outputs the output signal OUT1.

For instance, when the high side voltage VHSD is 17 V, the power supply voltage VPWR is 12 V, and the internal voltage VREG is 5 V, then the switching transistors M10 and M11 are each constituted of a high withstand voltage element having a withstand voltage of 20 V. In the low voltage side circuit 1, a low withstand voltage element having a withstand voltage of 5 V can be used for the MOS transistors constituting the inverters 11 and 12, the NMOS transistors 13A, 13B, and 13C, the MOS capacitors M12 and M13, and discharge switches M14 and M15. Therefore, in the low voltage side circuit 1, it is sufficient to use two types of withstand voltage elements, and hence a layout area can be reduced. In addition, only two high withstand voltage elements (the switching transistors M10 and M11) are necessary, and hence the layout area can be reduced.

<First State Change Operation>

Next, an operation in state change time of the level shift circuit 10 having the above structure is described. Note that a specific voltage value in the following description is merely an example. First, an operation when the input signal VIN is changed from 0 V (low level) to 5 V (high level) (first state change operation) is described with reference to FIGS. 3A and 4A.

Figure 3A:
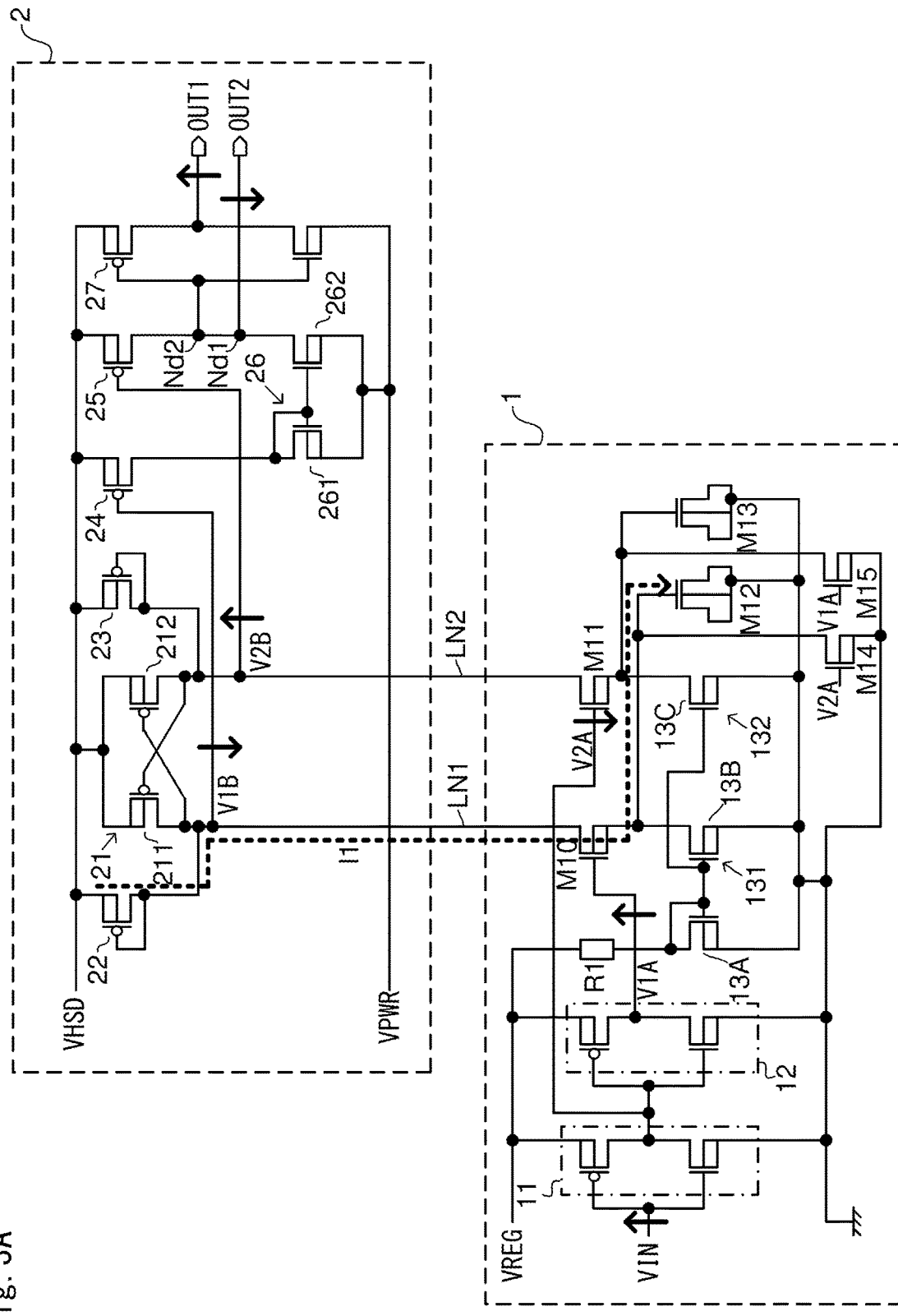
FIG. 3A is a diagram illustrating each signal state in a first state change operation of the level shift circuit.
Figure 3B:
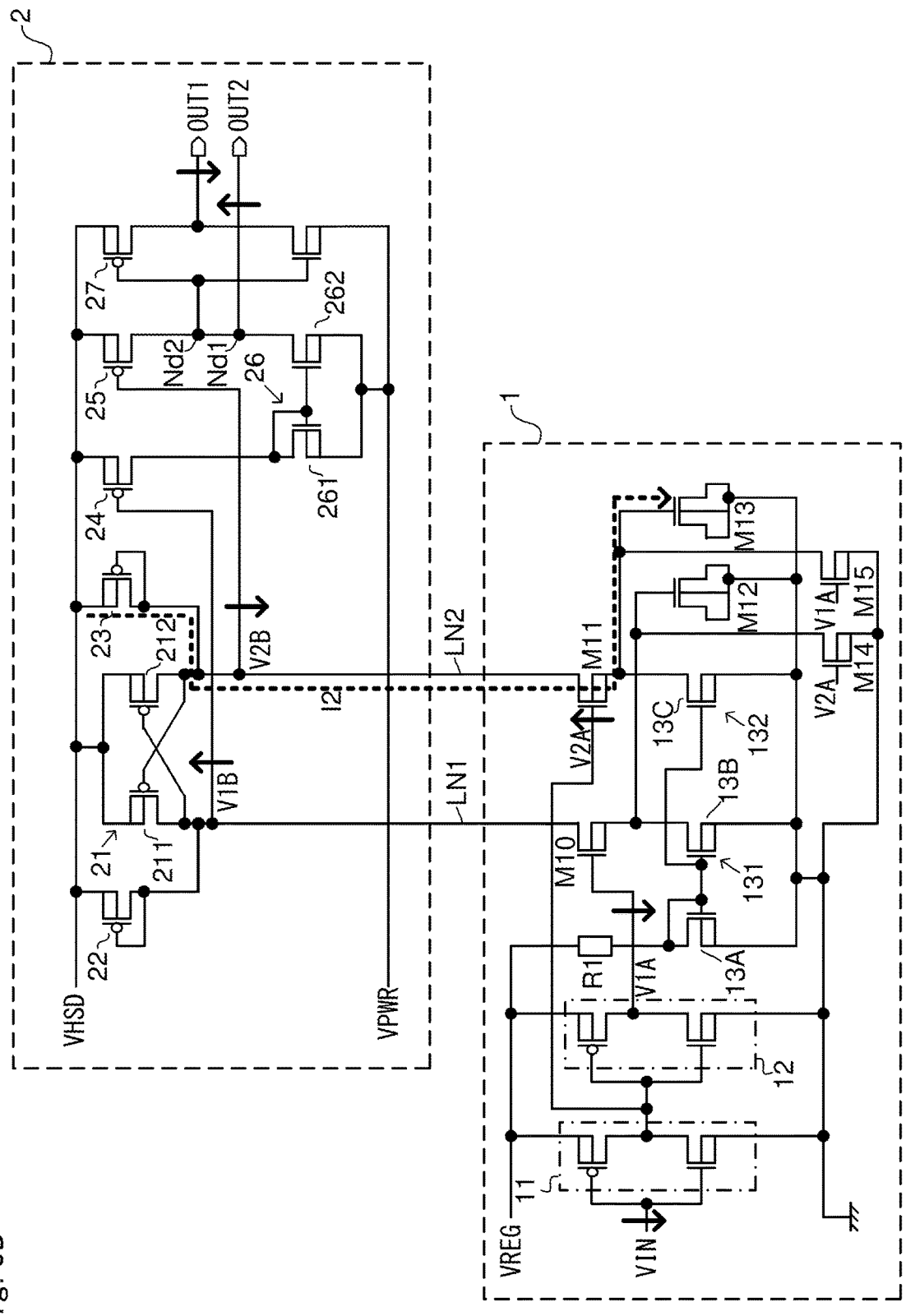
FIG. 3B is a diagram illustrating each signal state in a second state change operation of the level shift circuit.
Figure 4A:
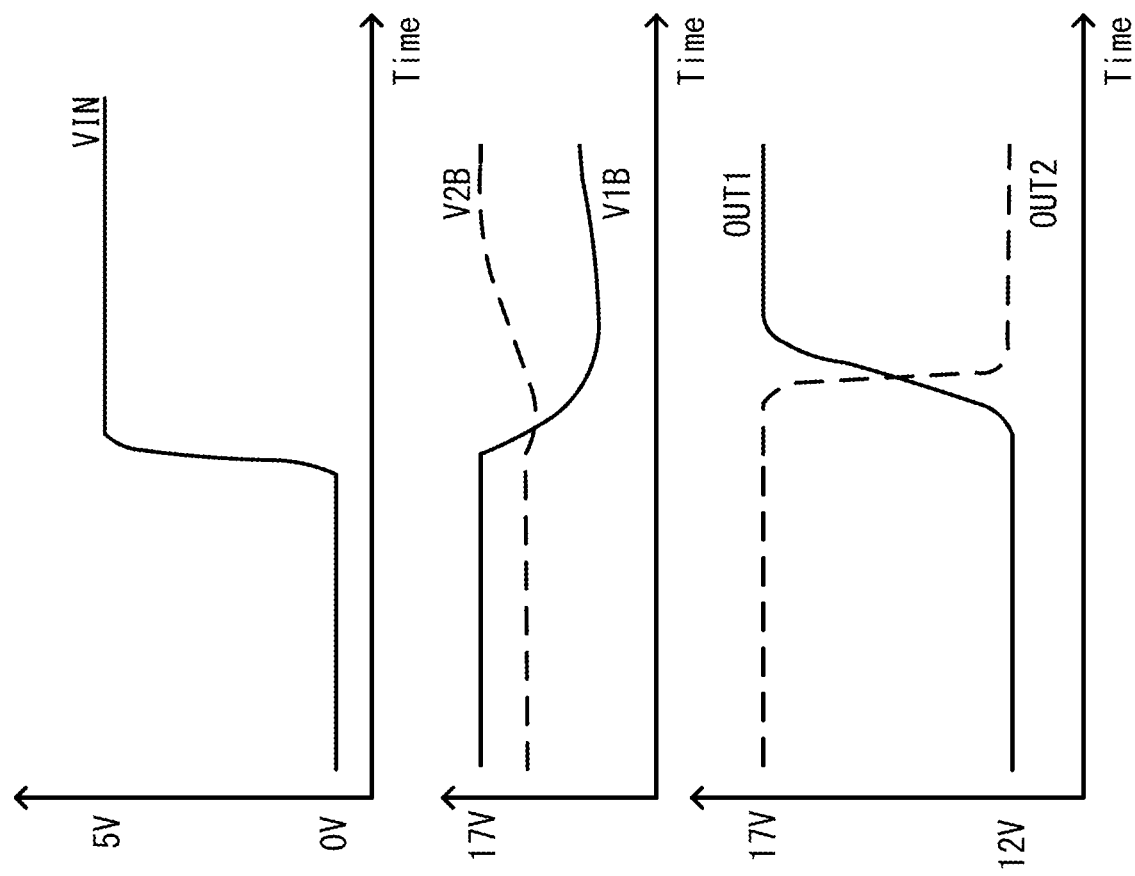
FIG. 4A is a diagram illustrating an example of voltage signal waveforms in the first state change operation.

FIG. 3A is a diagram illustrating each signal state in the first state change operation of the level shift circuit 10. Note that in FIG. 3A, an upward arrow of a voltage signal indicates a voltage increase, while a downward arrow indicates a voltage decrease, and the same is true in FIG. 3B that will be referred to later. In addition, FIG. 4A is a diagram illustrating an example of waveforms of voltage signals in the first state change operation. Note that in FIG. 4A, waveform examples of the input signal VIN, a voltage V1B of the signal line LN1, a voltage V2B of the signal line LN2, and the output signals OUT1 and OUT2 are shown from top to bottom, and the same is true in FIG. 4B that will be referred to later.

When the input signal VIN is changed from low level (0 V) to high level (5 V), a gate voltage V1A of the switching transistor M10 is changed from low level to high level, and a gate voltage V2A of the switching transistor M11 is changed from high level to low level. In this way, the switching transistor M10 is switched to on state, and the switching transistor M11 is switched to off state.

Here, a gate of the discharge switch M14 is controlled by the gate voltage V2A, and a gate of the discharge switch M15 is controlled by the gate voltage V1A. When the input signal VIN is changed from low level to high level, the MOS capacitor M12 is discharged in advance by the discharge switch M14. Therefore, when the switching transistor M10 is switched to on state, as the MOS capacitor M12 is in a non-charged state (zero charge state), a rush current I1 (large current) flows into the MOS capacitor M12 via the MOS diode 22, the signal line LN1, and the switching transistor M10.

In this way, a voltage Vds (voltage between drain and source) of the MOS diode 22 largely increases, and the voltage V1B of the signal line LN1 is largely decreased from the high side voltage VHSD (17 V). Then, in the latch circuit 21, the PMOS transistor 212 is changed from off state to on state at high speed, and the PMOS transistor 211 is changed from on state to off state at high speed. In this case, the voltage V2B of the signal line LN2 increases to the high side voltage VHSD (17 V), and the PMOS transistor 25 is switched to off state.

When the voltage V1B is decreased, current flows through the PMOS transistor 24, and the current is mirrored by the current mirror 26. In this way, the output voltage OUT1 is changed from low level (VPWR=12 V) to high level (VHSD=17 V), and the output voltage OUT2 is changed from high level (VHSD=17 V) to low level (VPWR=12 V).

After the rush current I1 flows, current generated by the internal voltage VREG and the resistor R1 is mirrored by the current mirror 131, and a steady state current flows through the switching transistor M10. For instance, the rush current is a few hundred μA, and the steady state current is a few μA. In steady state, the voltage V1B is clamped by the MOS diode 22. In addition, in steady state, voltage of the MOS capacitor M12 is clamped by the switching transistor M10 (clamped by VREG minus Vth (that is Vth of M10)). In this way, as the current in steady state is smaller than the rush current, lower current consumption can be achieved.

<Second State Change Operation>

Figure 4B:
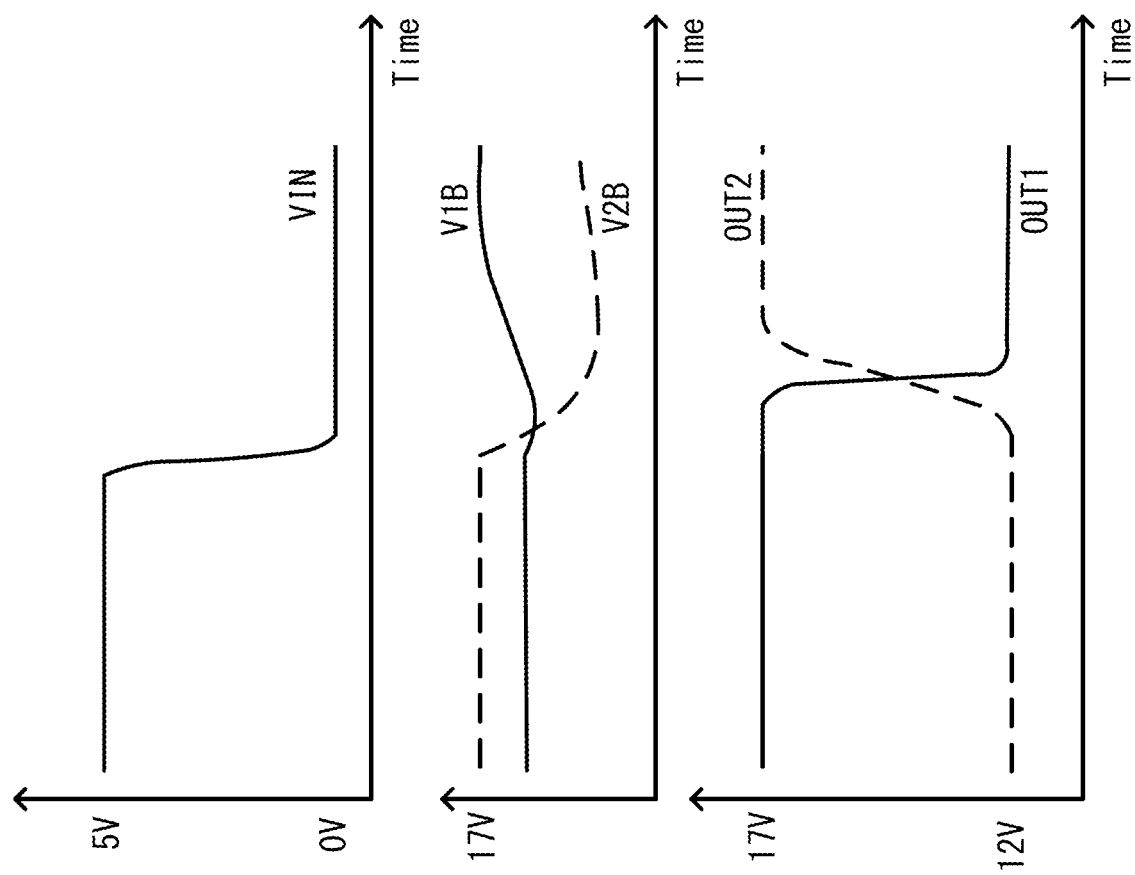
FIG. 4B is a diagram illustrating an example of the voltage signal waveforms in the second state change operation.

On the other hand, an operation when the input signal VIN is changed from high level (5 V) to low level (0 V) (second state change operation) is described with reference to FIG. 3B and FIG. 4B. FIG. 3B is a diagram illustrating each signal state of the level shift circuit 10 in the second state change operation. FIG. 4B is a diagram illustrating an example of waveforms of voltage signals in the second state change operation.

When the input signal VIN is changed from high level to low level, the gate voltage V1A of the switching transistor M10 is changed from high level to low level, and the gate voltage V2A of the switching transistor M11 is changed from low level to high level. In this way, the switching transistor M10 is switched to off state, and the switching transistor M11 is switched to on state.

In this case, the MOS capacitor M13 is discharged in advance by the discharge switch M15. Therefore, when the switching transistor M11 is switched to on state, as the MOS capacitor M13 is in a non-charged state (zero charge state), a rush current I2 (large current) flows into the MOS capacitor M13 via the MOS diode 23, the signal line LN2, and the switching transistor M11.

In this way, a voltage Vds of the MOS diode 23 largely increases, and the voltage V2B of the signal line LN2 is largely decreased from the high side voltage VHSD (17 V). Then, in the latch circuit 21, the PMOS transistor 211 is changed from off state to on state at high speed, and the PMOS transistor 212 is changed from on state to off state at high speed. In this case, the voltage V1B of the signal line LN1 increases to the high side voltage VHSD (17 V), and the PMOS transistor 24 is switched to off state.

When the voltage V2B is decreased, current flows through the PMOS transistor 25, and the output voltage OUT1 is changed from high level (VHSD=17 V) to low level (VPWR=12 V), and the output voltage OUT2 is changed from low level (VPWR=12 V) to high level (VHSD=17 V).

After the rush current I2 flows, current generated by the internal voltage VREG and the resistor R1 is mirrored by the current mirror 132, and the steady state current flows through the switching transistor M11. In steady state, the voltage V2B is clamped by the MOS diode 23. In addition, in steady state, voltage of the MOS capacitor M13 is clamped by the switching transistor M11 (clamped by VREG minus Vth (that is Vth of M11)). In this way, current in steady state is smaller than the rush current, and hence lower current consumption can be achieved.

In this way, in the level shift circuit 10 according to this embodiment, signal transmission from the low voltage side circuit 1 to the high voltage side circuit 2 is performed by current. Utilizing the characteristics that the MOS capacitor in the zero charge state can sink a large current, the rush current is generated in state change time using the MOS capacitors M12 and M13, and the parasitic capacitance of the circuit is quickly charged and discharged, so that the levels of the output signals OUT1 and OUT2 can be changed at high speed. For instance, rising time Tr and falling time Tf of the signal can be both 1 ns or less. After the rush current flows transiently, the steady state is maintained. Current consumption in the steady state is suppressed. Note that the rush current is limited by capacitance of the MOS capacitor, on-resistance of the switching transistor, impedance of the MOS diode, or the like.

In this way, the structure for transiently generating large current can be simplified by the MOS capacitor, and the control circuit having the complicated structure of the comparative example as described above is not necessary. In addition, by supplying the rush current to the MOS diodes 22 and 23 in the high voltage side circuit 2, the signal transmission (UV conversion) can be performed transiently at high speed.

Variation

Figure 5:
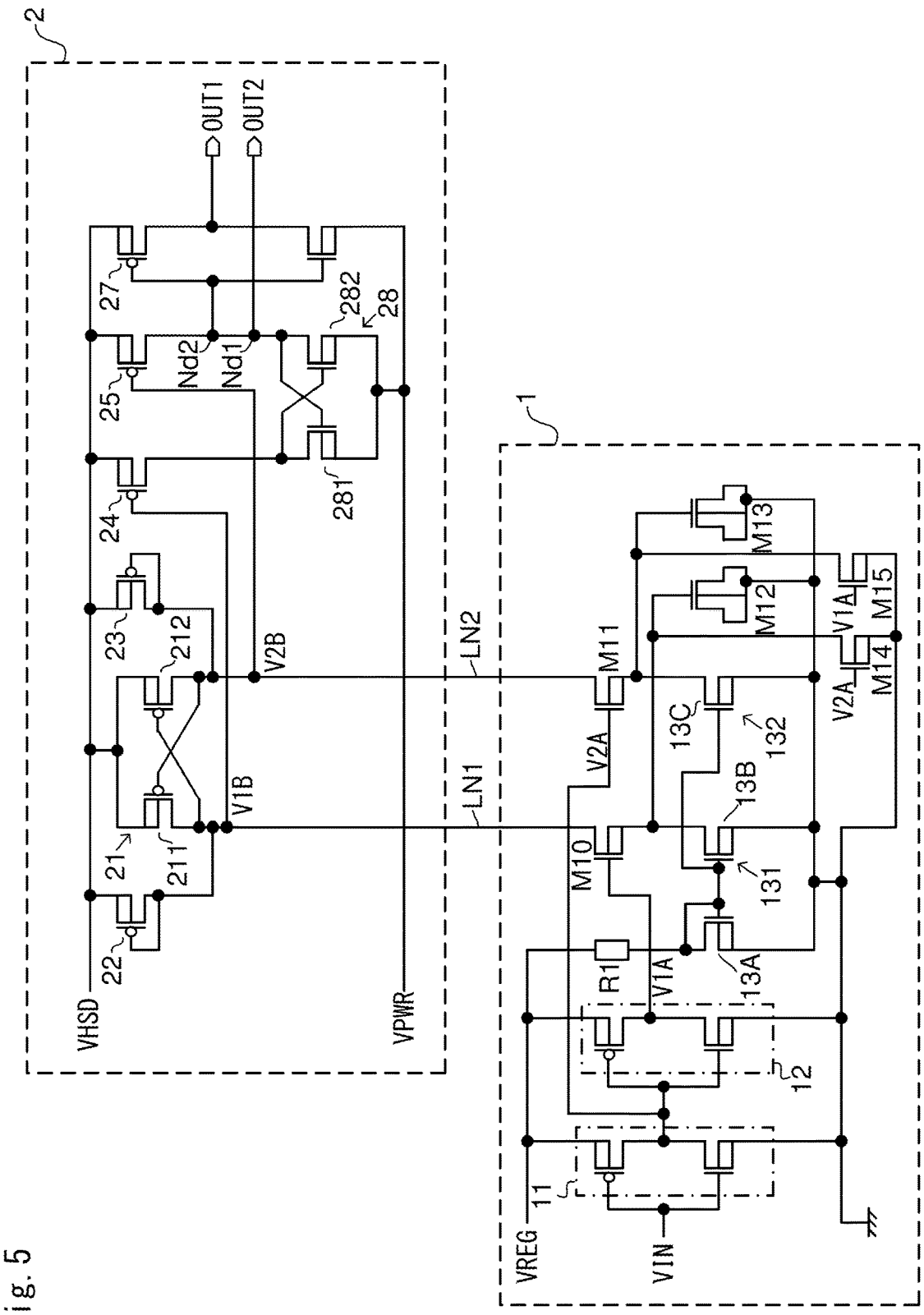
FIG. 5 is a diagram illustrating a structure of the level shift circuit according to a variation of the present disclosure.

FIG. 5 is a diagram illustrating a structure of the level shift circuit 10 according to a variation of the present disclosure. In this variation, in the high voltage side circuit 2, a latch circuit 28 is used instead of the current mirror 26 described above. The latch circuit 28 includes NMOS transistors 281 and 282. Specifically, a gate of the NMOS transistor 281 is connected to a drain of the NMOS transistor 282. A gate of the NMOS transistor 282 is connected to a drain of the NMOS transistor 281. Sources of the NMOS transistors 281 and 282 are connected to the application terminal of the power supply voltage VPWR. The drain of the NMOS transistor 281 is connected to the drain of the PMOS transistor 24. The drain of the NMOS transistor 282 is connected to the drain of the PMOS transistor 25.

For instance, in the structure illustrated in FIG. 3A, in steady time, the current mirror constituted of the MOS diode 22 and the PMOS transistor 24 allows current of a few μA to flow from the PMOS transistor 24 to the input side transistor 261. In contrast, in the structure illustrated in FIG. 5, there is no current path from the high side voltage VHSD to the power supply voltage VPWR, and current is prevented from flowing in steady time, so that lower current consumption can be achieved.

Figure 6:
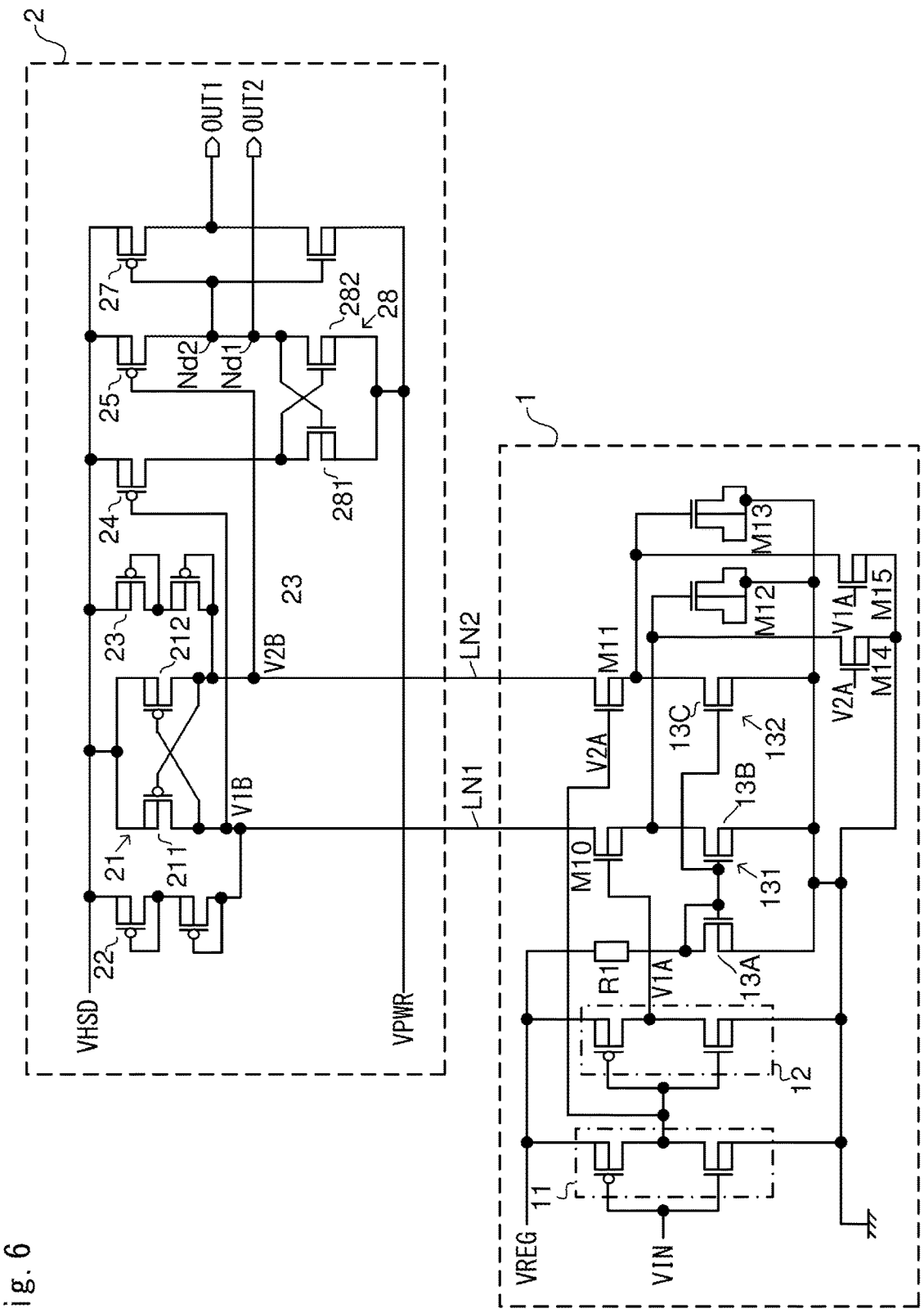
FIG. 6 is a diagram illustrating a variation of the structure illustrated in FIG. 5.

FIG. 6 is a diagram illustrating a variation of the structure illustrated in FIG. 5. FIG. 6 illustrates a structure in which a plurality of the MOS diodes 22, 23 are connected in series. In this way, when the rush current is generated, the gate voltages V1B and V2B of the PMOS transistors 24 and 25 that drive the latch circuit 28 change largely, and hence higher speed operation can be realized.

Note that also in the structure illustrated in FIG. 2, a plurality of the MOS diodes 22, 23 may be connected in series in the same manner as described above. In this way, higher speed operation can be realized.

Others

Note that various technical features disclosed in this specification can be variously modified within the scope of this technical creation without deviating from the spirit thereof, other than the embodiment described above. In other words, the above embodiment is merely an example in every respect and should not be interpreted as a limitation. The technical scope of the present invention is not limited to the above embodiment, but should be understood to include all modifications within meaning and scope equivalent to the claims.

Additional Note

As described above, a level shift circuit (10) according to an aspect of the present disclosure includes:
- a low voltage side circuit (1) arranged to receive an input signal (VIN); and
- a high voltage side circuit (2) arranged to output an output signal (OUT1, OUT2) obtained by level shifting the input signal, wherein
- the low voltage side circuit includes a switching transistor (M10, M11) arranged to switch between on state and off state according to the level of the input signal, and a capacitor (M12, M13) connected in a path where current flows from the high voltage side circuit via the switching transistor, and
- when the switching transistor switches to on state, rush current is generated, which is a transitional large current flowing through the path by the capacitor, so that level of the output signal is switched (first structure).

In addition, in the first structure, it may be possible that the low voltage side circuit (1) includes a first current mirror (131, 132) connected to the switching transistor (M10, M11), and a resistor (R1) connected between the first current mirror and an application terminal of a first predetermined voltage (VREG) (second structure).

In addition, in the first or second structure, it may be possible that the low voltage side circuit (1) includes a discharge switch (M14, M15) arranged to discharge the capacitor (M12, M13) (third structure).

In addition, in one of the first to third structures, it may be possible that the low voltage side circuit (1) and the high voltage side circuit (2) are connected via a first signal line (LN1) and a second signal line (LN2),
- the switching transistor includes a first switching transistor (M10) connected to the first signal line, and a second switching transistor (M11) connected to the second signal line, and
- the capacitor includes a first capacitor (M12) connected to the first switching transistor, and a second capacitor (M13) connected to the second switching transistor (fourth structure).

In addition, in the fourth structure, it may be possible that the high voltage side circuit (2) includes:
- a first latch circuit (21) connected to the first switching transistor (M10) and the second switching transistor (M11);
- a first diode (22) connected between an application terminal of a second predetermined voltage (VHSD) and the first switching transistor; and
- a second diode (23) connected between the application terminal of the second predetermined voltage and the second switching transistor (fifth structure).

In addition, in the fifth structure, it may be possible that the high voltage side circuit (2) includes:
- a first PMOS transistor (24) having a gate connected to the first signal line (LN1), and a source connected to the application terminal of the second predetermined voltage (VHSD);
- a second PMOS transistor (25) having a gate connected to the second signal line (LN2) and a source connected to the application terminal of the second predetermined voltage; and
- a second current mirror (26) having an input side transistor (261) connected to a drain of the first PMOS transistor, and an output side transistor (262) connected to a drain of the second PMOS transistor (sixth structure).

In addition, in the fifth structure, it may be possible that the high voltage side circuit (2) includes:
- a first PMOS transistor (24) having a gate connected to the first signal line (LN1), and a source connected to the application terminal of the second predetermined voltage (VHSD);
- a second PMOS transistor (25) having a gate connected to the second signal line (LN2), and a source connected to the application terminal of the second predetermined voltage; and
- a second latch circuit (28) connected to a drain of the first PMOS transistor and a drain of the second PMOS transistor (seventh structure).

In addition, in one of the fifth to seventh structures, the first diode (22) and the second diode (23) may be constituted of a plurality of MOS diodes connected in series (eighth structure).

In addition, in one of the fourth to eighth structures, it may be possible that the low voltage side circuit (1) includes:
- a first discharge switch (M14) arranged to discharge the first capacitor (M12); and
- a second discharge switch (M15) arranged to discharge the second capacitor (M13), wherein
- the first discharge switch is arranged to be controlled by a signal (V2A) that controls the second switching transistor (M11), and
- the second discharge switch is arranged to be controlled by a signal (V1A) that controls the first switching transistor (M10) (ninth structure).

What is claimed is:

1. A level shift circuit comprising:
a low voltage side circuit arranged to receive an input signal; and
a high voltage side circuit arranged to output an output signal obtained by level shifting the input signal, wherein
the low voltage side circuit includes:
 a switching transistor arranged to switch between on state and off state according to a level of the input signal;
 a first current mirror connected to the switching transistor;
 a resistor connected between the first current mirror and an application terminal of a first predetermined voltage; and
 a capacitor connected in a path where current flows from the high voltage side circuit via the switching transistor, and
when the switching transistor switches to on state, transitional rush current is generated, which flows through the path by the capacitor, so that a level of the output signal is switched.

2. The level shift circuit according to claim 1, wherein the low voltage side circuit includes a discharge switch arranged to discharge the capacitor.

3. The level shift circuit according to claim 1, wherein
the low voltage side circuit and the high voltage side circuit are connected via a first signal line and a second signal line,
the switching transistor includes a first switching transistor connected to the first signal line, and a second switching transistor connected to the second signal line, and
the capacitor includes a first capacitor connected to the first switching transistor, and a second capacitor connected to the second switching transistor.

4. The level shift circuit according to claim 3, wherein the high voltage side circuit includes:
a first latch circuit connected to the first switching transistor and the second switching transistor;
a first diode connected between an application terminal of a second predetermined voltage and the first switching transistor; and
a second diode connected between the application terminal of the second predetermined voltage and the second switching transistor.

5. The level shift circuit according to claim 4, wherein the high voltage side circuit includes:
a first PMOS transistor having a gate connected to the first signal line, and a source connected to the application terminal of the second predetermined voltage;
a second PMOS transistor having a gate connected to the second signal line and a source connected to the application terminal of the second predetermined voltage; and
a second current mirror having an input side transistor connected to a drain of the first PMOS transistor, and an output side transistor connected to a drain of the second PMOS transistor.

6. The level shift circuit according to claim 4, wherein the high voltage side circuit includes:
a first PMOS transistor having a gate connected to the first signal line, and a source connected to the application terminal of the second predetermined voltage;
a second PMOS transistor having a gate connected to the second signal line, and a source connected to the application terminal of the second predetermined voltage; and
a second latch circuit connected to a drain of the first PMOS transistor and a drain of the second PMOS transistor.

7. The level shift circuit according to claim 4, wherein the first diode and the second diode are constituted of a plurality of MOS diodes connected in series.

8. The level shift circuit according to claim 3, wherein
the low voltage side circuit includes a first discharge switch arranged to discharge the first capacitor, and a second discharge switch arranged to discharge the second capacitor,
the first discharge switch is arranged to be controlled by a signal that controls the second switching transistor, and
the second discharge switch is arranged to be controlled by a signal that controls the first switching transistor.

9. A level shift circuit comprising:
a low voltage side circuit arranged to receive an input signal; and
a high voltage side circuit arranged to output an output signal obtained by level shifting the input signal, wherein
the low voltage side circuit includes:
a switching transistor arranged to switch between on state and off state according to a level of the input signal; and
a capacitor connected in a path where current flows from the high voltage side circuit via the switching transistor,
the low voltage side circuit and the high voltage side circuit are connected via a first signal line and a second signal line,
the switching transistor includes a first switching transistor connected to the first signal line, and a second switching transistor connected to the second signal line,
the capacitor includes a first capacitor connected to the first switching transistor, and a second capacitor connected to the second switching transistor,
the high voltage side circuit includes:
a first latch circuit connected to the first switching transistor and the second switching transistor;
a first diode connected between an application terminal of a second predetermined voltage and the first switching transistor;
a second diode connected between the application terminal of the second predetermined voltage and the second switching transistor;
a first PMOS transistor having a gate connected to the first signal line, and a source connected to the application terminal of the second predetermined voltage;
a second PMOS transistor having a gate connected to the second signal line and a source connected to the application terminal of the second predetermined voltage; and
a second current mirror having an input side transistor connected to a drain of the first PMOS transistor, and an output side transistor connected to a drain of the second PMOS transistor, and
when the switching transistor switches to on state, transitional rush current is generated, which flows through the path by the capacitor, so that a level of the output signal is switched.

10. A level shift circuit comprising:
a low voltage side circuit arranged to receive an input signal; and
a high voltage side circuit arranged to output an output signal obtained by level shifting the input signal, wherein
the low voltage side circuit includes:
a switching transistor arranged to switch between on state and off state according to a level of the input signal; and
a capacitor connected in a path where current flows from the high voltage side circuit via the switching transistor,
the low voltage side circuit and the high voltage side circuit are connected via a first signal line and a second signal line,
the switching transistor includes a first switching transistor connected to the first signal line, and a second switching transistor connected to the second signal line, and
the capacitor includes a first capacitor connected to the first switching transistor, and a second capacitor connected to the second switching transistor, wherein the low voltage side circuit includes:
  a first discharge switch arranged to discharge the first capacitor; and
  a second discharge switch arranged to discharge the second capacitor,
the first discharge switch is arranged to be controlled by a signal that controls the second switching transistor,
the second discharge switch is arranged to be controlled by a signal that controls the first switching transistor, and
when the switching transistor switches to on state, transitional rush current is generated, which flows through the path by the capacitor, so that a level of the output signal is switched.

* * * * *